(12) United States Patent  
Komiya et al.

(10) Patent No.: US 7,009,345 B2
(45) Date of Patent: Mar. 7, 2006

(54) EMISSIVE DISPLAY DEVICE AND ELECTROLUMINESCENCE DISPLAY DEVICE WITH UNIFORM LUMINANCE

(75) Inventors: Naoaki Komiya, Ohgaki (JP); Ryoichi Yokoyama, Ohgaki (JP); Tsutomu Yamada, Gifu (JP); Ryuji Nishikawa, Gifu (JP)

(73) Assignee: Sanyo Electric Co., Ltd., (JP)

( * ) Notice: Subject to any disclaimer, the term of this patent is extended or adjusted under 35 U.S.C. 154(b) by 134 days.

(21) Appl. No.: 10/748,928

(22) Filed: Dec. 30, 2003

(65) Prior Publication Data

US 2004/0150351 A1    Aug. 5, 2004

Related U.S. Application Data

(63) Continuation of application No. 09/510,853, filed on Feb. 23, 2000, now Pat. No. 6,724,149.

(30) Foreign Application Priority Data

Feb. 24, 1999   (JP) .................................. 11-46741
Sep. 29, 1999   (JP) ................................. 11-277084

(51) Int. Cl.
   *G09G 3/10*   (2006.01)

(52) U.S. Cl. .................................. 315/169.3; 313/505

(58) Field of Classification Search .. 315/169.1–169.3; 345/76, 77, 82, 92, 84; 313/500, 502–506
See application file for complete search history.

(56) References Cited

U.S. PATENT DOCUMENTS

| | | | |
|---|---|---|---|
| 3,869,646 A | 3/1975 | Kirton et al. ............... 315/246 |
| 4,459,514 A | 7/1984 | Morimoto et al. ........ 315/169.1 |
| 4,704,559 A | 11/1987 | Suginoya et al. ......... 315/169.1 |
| 5,670,792 A | 9/1997 | Utsugi et al. .................. 257/59 |
| 5,684,365 A | 11/1997 | Tang et al. ............... 315/169.3 |
| 5,966,189 A | 10/1999 | Matsuo ......................... 349/38 |
| 6,545,652 B1 * | 4/2003 | Tsuji ............................ 345/82 |
| 2002/0105279 A1 * | 8/2002 | Kimura .................... 315/169.3 |
| 2003/0085854 A1 * | 5/2003 | Tsuji ............................ 345/82 |

OTHER PUBLICATIONS

Japanese Notice of Grounds for Rejection for Patent Application Serial No. HEI 11-046741, dated Aug. 27, 2002 with English Translation.
Patent Abstracts of Japan, Publication No. 09-081053, dated Mar. 28, 1997.
Japanese Patent Laid Open Publication No. HEI 10-239699, dated Sep. 11, 1998 with English Abstract and partial English translation.

* cited by examiner

Primary Examiner—Trinh Vo Dinh
(74) Attorney, Agent, or Firm—Cantor Colburn LLP (57) ABSTRACT

Power source lines (183) for supplying drive current from power source input terminals (180) to organic EL elements (160) formed in a display pixel region having display pixels are connected by a bypass line (181) along the row direction within the display pixel region. This arrangement minimizes decrease in power source current caused by resistance of the power source lines (183) according to the line length. Accordingly, the organic EL elements (160) can adequately receive the actual desired current, thereby achieving an organic EL device capable of bright displays and having uniform display luminance within the display region.

25 Claims, 7 Drawing Sheets

EMISSIVE DISPLAY DEVICE AND ELECTROLUMINESCENCE DISPLAY DEVICE WITH UNIFORM LUMINANCE

CROSS-REFERENCE TO RELATED APPLICATION

This application is a continuation of U.S. patent application Ser. No. 09/510,853, filed Feb. 23, 2000, now U.S. Pat. No. 6,724,149, the entire contents of which are incorporated herein by reference.

BACKGROUND OF THE INVENTION

1. Field of the Invention

The present invention relates to an emissive display device using emissive elements, such as electroluminescence elements, which employs thin film transistors for controlling such elements.

2. Description of the Related Art

In recent years, electroluminescence (referred to hereinafter as "EL") display devices comprising EL elements have gained attention as potential replacements for CRTs and LCDs. Research has been directed to the development of EL display devices using, for example, thin film transistors (referred to hereinafter as "TFT") as switching elements to drive the EL elements.

Figure 1:
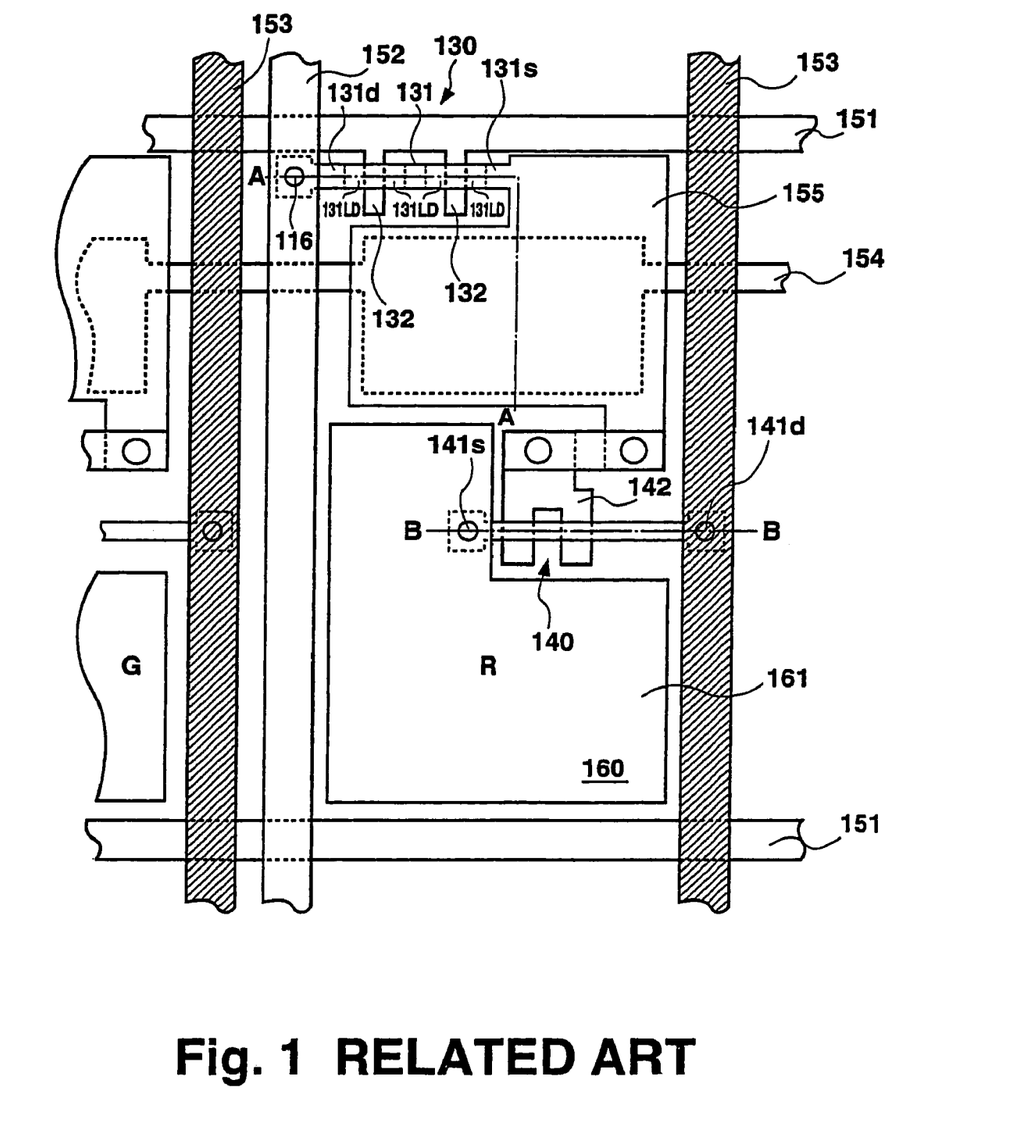
FIG. 1 is a plan view illustrating a related art EL display device.
Figure 2:
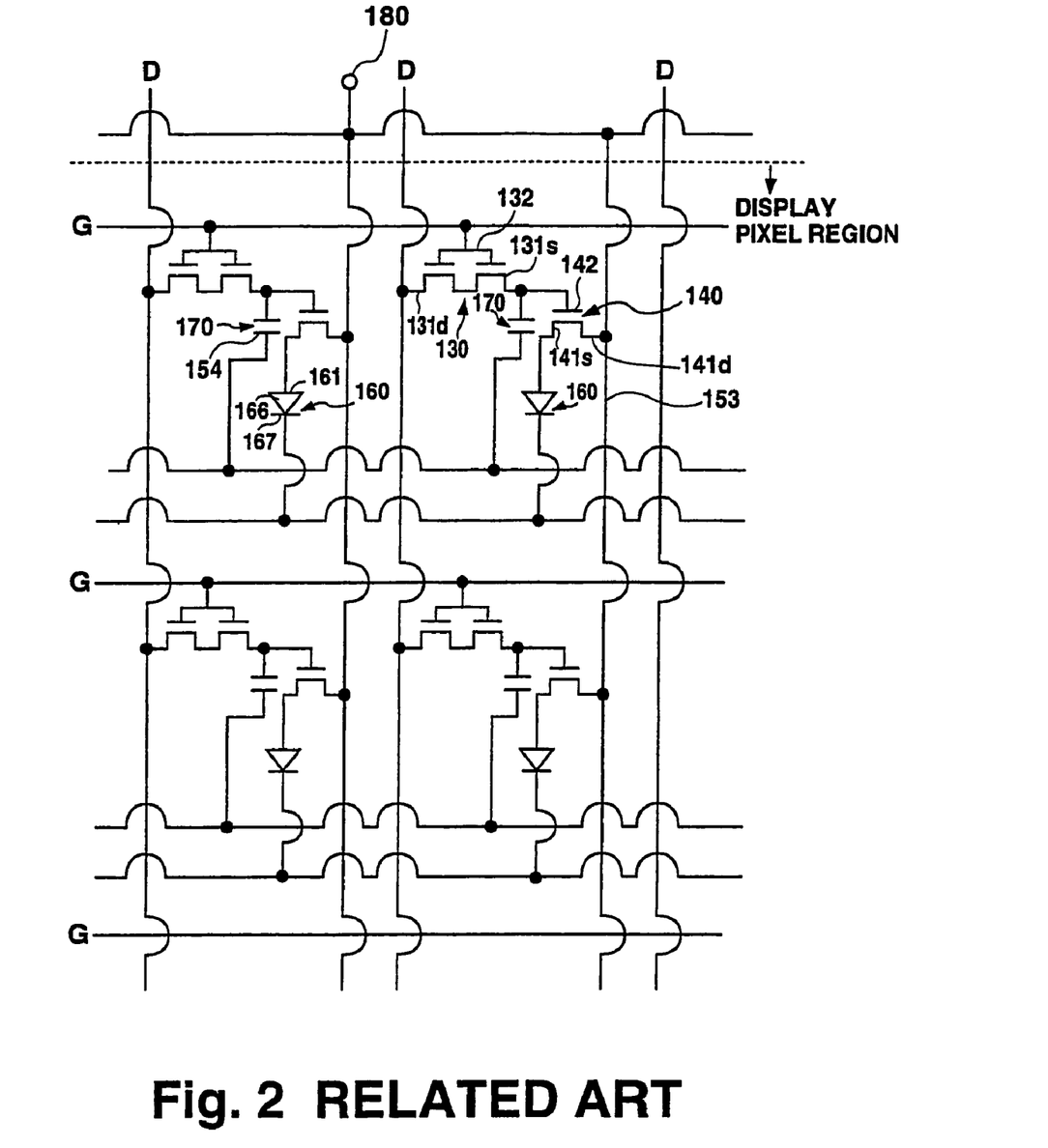
FIG. 2 is a diagram showing an equivalent circuit for display pixels of the related art EL display device.
Figure 3A:
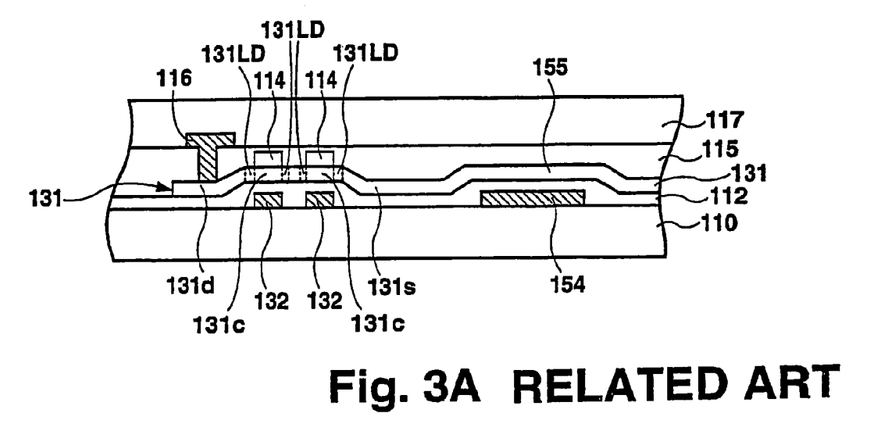
FIG. 3A shows a cross-sectional view taken along line A—A of FIG. 1.
Figure 3B:
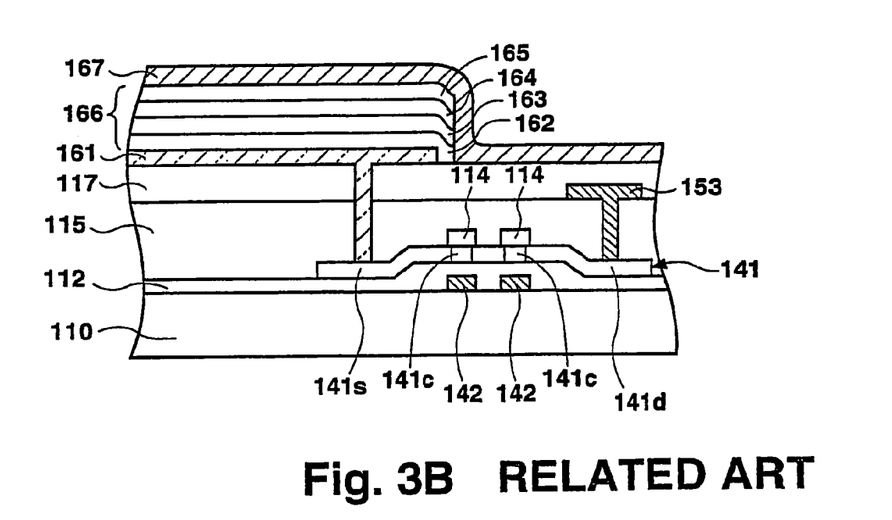
FIG. 3B shows a cross-sectional view taken along line B—B of FIG. 1.

FIG. 1 is a plan view showing one display pixel of an organic EL display device. FIG. 2 illustrates an equivalent circuit for a plurality of display pixels in an organic EL display device. FIG. 3A shows a cross-sectional view taken along line A—A of FIG. 1, while FIG. 3B shows a cross-sectional view taken along line B—B of FIG. 1.

As shown in FIGS. 1, 2, 3A, and 3B, each display pixel is formed in a region surrounded by gate signal lines 151 and drain signal lines 152. A first TFT serving as a switching element is disposed near a intersection of those signal lines. The source 131s of the TFT simultaneously functions as a capacitor electrode 155 such that, together with the opposing storage capacitor electrode 154 described later, it forms a capacitor. The source 131s is connected to a gate electrode 142 of a second TFT 140 that drives the organic EL element. The source 141s of the second TFT 140 contacts with the anode 161 of the organic EL element. The drain 141d is connected to a power source line 153.

Near the TFT 130, a storage capacitor electrode 154 is disposed in parallel with a gate signal line 151. The storage capacitor electrode 154 is made of a material such as chromium. The storage capacitor electrode 154 contacts the capacitor electrode 155 via a gate insulating film 112 and together stores charges, forming a capacitor. The capacitor electrode 155 is connected to the source 131s of the first TFT 130. This storage capacitor is provided for retaining voltage applied to the gate 142 of the second TFT 140.

The first TFT 130, or the switching TFT, will now be explained.

As shown in FIGS. 1 and 3A, gate signal lines 151 made of refractory metal such as chromium (Cr) or molybdenum (Mo), which also serve as gate electrodes 132, are formed on an insulator substrate 110 made of quartz glass, non-alkali glass, or a similar material. Also disposed on the substrate 110 are drain signal lines 152 composed of aluminum (Al) and power source lines 153 also composed of Al and serving as the power source for the organic EL elements.

After forming gate signal lines 151 on the substrate 110, a gate insulating film 112 and an active layer 131 composed of poly-silicon (referred to hereinafter as "p-Si") film are sequentially formed. The active layer 131 is of a so-called LDD (Lightly Doped Drain) structure. Specifically, low-concentration regions 131LD are formed on both sides of each gate 132. The source 131s and the drain 131d, which are high-concentration regions, are further disposed on the outboard sides of the low-concentration regions 131LD.

An interlayer insulating film 115 formed by sequential lamination of a $SiO_2$ film, a SiN film, and a $SiO_2$ film is provided on the entire surface over the gate insulating film 112, the active layer 131, and stopper insulating films 114. A contact hole formed in a position corresponding to the drain 141d is filled with metal such as Al, forming a drain electrode 116. Further, a planarizing insulating film 117 made of an organic resin or a similar material is formed over the entire surface for planarization.

The second TFT 140, or the TFT for driving the organic EL element, will next be described.

As shown in FIG. 3B, gate electrodes 142 composed of refractory metal such as Cr or Mo are formed on the insulator substrate 110 made of quartz glass, non-alkali glass, or a similar material. Further on top, a gate insulating film 112 and an active layer 141 composed of p-Si film are sequentially formed. The active layer 141 is provided with intrinsic or substantially intrinsic channels 141c formed above the gate electrodes 142, and the source 141s and drain 141d are formed on respective sides of these channels 141c by ion doping using p-type impurities, thereby constituting a p-type channel TFT.

An interlayer insulating film 115 formed by sequential lamination of a $SiO_2$ film, a SiN film, and a $SiO_2$ film is provided on the entire surface over the gate insulating film 112 and the active layer 141. A contact hole formed in a position corresponding to the drain 141d is filled with metal such as Al, forming a power source line 153 connected to a power source. Further, a planarizing insulating film 117 made of an organic resin or a similar material is formed over the entire surface for planarization. A contact hole is formed in the planarizing insulating film 117 in a position corresponding to the source 141s. A transparent electrode made of ITO (indium tin oxide) that contacts the source 141s through this contact hole, namely, the anode 161 of the organic EL element, is formed on the planarizing insulating film 117.

The organic EL element 160 is formed by laminating, in order, the anode 161 constituted by a transparent electrode made of ITO or similar material, an emissive element layer 166 which is composed with materials including an organic compound and comprises an emissive layer, and a cathode 167 made of a magnesium-indium alloy. The cathode 167 is disposed over the entire surface of the organic EL display element shown in FIG. 1, that is covering the entire sheet of the figure.

In an organic EL element, holes injected from the anode and electrons injected from the cathode recombine in the emissive layer. As a result, organic molecules constituting the emissive layer are excited, generating excitons. Through the process in which these excitons undergo radiation until deactivation, light is emitted from the emissive layer. This light radiates outward through the transparent anode via the transparent insulator substrate, resulting in light emission.

In this way, electric charge applied via the source 131s of the first TFT 130 is accumulated in the storage capacitor 170 and applied to the gate 142 of the second TFT 140. According to this voltage, the organic EL element emits light.

As shown in FIG. 2, each power source line connected to the power source for driving the organic EL elements is connected with a power source input terminal 180 disposed outside the display pixel region. The power source lines are arranged and connected with each vertical array of display pixels. With such an arrangement, at positions more distant from the power source input terminal 180 resistance of each power source line increases along with its length. The organic EL elements 160 located in display pixels distant from the power source input terminal 180 are therefore not adequately provided with necessary current, causing a disadvantage that the display in such area is dim.

SUMMARY OF THE INVENTION

The present invention was created in light of the above existing disadvantage. The purpose of the present invention is to provide an EL display device which prevents decrease in power source current due to resistance of power source lines, and adequately provides EL elements with current that should actually be supplied, accomplishing bright display.

To achieve the above purpose, the present invention provides an electroluminescence display device comprising a plurality of display pixels arranged in a matrix within a display pixel region, said display pixels having electroluminescence elements including an emissive layer between first and second electrodes, wherein, within said display pixel region, power source line for supplying power from a power source to said electroluminescence elements is disposed in a grid pattern.

According to another aspect of the present invention, said power source line includes main power source lines arranged in plural numbers within said display pixel region, and at least one bypass power source line extended to intersect and connect said main power lines within said display pixel region.

In a further aspect of the present invention, each of said display pixels further comprises a first thin film transistor having a gate electrode connected to a gate line, and a first electrode region connected to a data line; and a second thin film transistor having a gate electrode connected to a second electrode region of said first thin film transistor, a first electrode region connected to one of said main power source lines, and a second electrode region connected to said electroluminescence element.

In a still further aspect of the present invention, an emissive display device comprises a plurality of display pixels arranged in a matrix within a display pixel region, each of said display pixels having emissive elements including an emissive layer between first and second electrodes; wherein, within said display pixel region, power source line for supplying power from a power source to said emissive elements is disposed in a grid pattern.

According to another aspect of the present invention, in any one of the above-described devices, said power source line includes main power source lines arranged in plural numbers along the column direction of said matrix within said display pixel region, and at least one bypass power source line extended in the row direction of said matrix to intersect and connect a plurality of said main power lines.

According to a further aspect of the present invention, in any one of the above-described devices, each of said display pixels further comprises a first thin film transistor having a gate electrode connected to a gate line, and a first electrode region connected to a data line; and a second thin film transistor having a gate electrode connected to a second electrode region of said first thin film transistor, a first electrode region connected to one of said main power source lines, and a second electrode region connected to said electroluminescence element or said emissive element.

In another aspect of the present invention, there is provided an electroluminescence display device comprising a display pixel region having a plurality of display pixels arranged in a matrix. Each of said display pixels includes an electroluminescence element having an emissive layer between an anode and a cathode; a first thin film transistor having a gate electrode connected to a gate line, and a first electrode region connected to a data line; and a second thin film transistor having a gate electrode connected to a second electrode region of said first thin film transistor, a first electrode region connected to a power source line for supplying power from a power source to said electroluminescence element, and a second electrode region connected to said electroluminescence element. Said power source line is provided in plural numbers along the column direction of said matrix within said display pixel region, and those power source lines that are associated with the display pixels adjacently arranged along the row direction are connected to one another via a bypass power source line extending in the row direction of said matrix.

As described above, the power source line for supplying power (current or voltage) from the power source to emissive elements such as electroluminescence elements is arranged in a grid pattern. Alternatively, a plurality of main power source lines may be electrically connected by bypass power source line(s) arranged to intersect the main power source lines. Such an arrangement can minimize the difference between power supplied to emissive elements located near and far from the power source that arises from wiring resistance of the power source lines. Accordingly, the power that should be supplied can adequately be provided to each display pixel emissive element. Irregularities in the luminance between the display pixels that emit light according to supplied power can thereby be reduced, accomplishing uniform light emission within the display pixel region.

According to a still further aspect of the present invention, in any one of the above-described devices, said first and said second thin film transistors include active layers composed of poly-silicon.

Use of thin film transistors, especially those employing poly-silicon as the active layers, as elements for controlling the emissive elements can contribute to large display size and high resolution in display devices because thin film transistors are capable of high-speed operation and control emissive elements to reliably emit light during an appropriate period of time. Further, pixel driver circuits comprising poly-silicon thin film transistors created using similar processes as the TFTs within the pixel region can be integrated on the same substrate where the display pixel region is formed. This can contribute to reducing the size of margins in a display device and to reduction in manufacturing cost of the overall display device.

In another aspect of the present invention, said emissive layer may be a layer using an organic compound as an emissive material. Forming the emissive layer using an organic compound can be extremely advantageous especially in a color display device because organic compounds can provide many variations in emitted colors and a wide selection of materials.

According to another aspect of the present invention, said main power source lines and said bypass power source line are conductive line integrally formed. Alternatively, said main power source lines and said bypass power source line may be conductive lines separately formed in different processes.

In a further aspect of the present invention, said bypass power source line in the above-described device is formed in a layer located underneath said main power source lines and separated by an insulating layer, and is connected to said main power source lines via contact holes.

In a still further aspect of the present invention, said bypass power source line is formed in a same layer as a gate line.

According to a further aspect of the present invention, said bypass power source line is formed on a gate insulating film, and an interlayer insulating film that separates the active layer of said second thin film transistor and a main power source lines is provided between said bypass power source line and said main power source line as said insulating layer.

These arrangements allow efficient and reliable formation of the main power source lines and the bypass power line.

DESCRIPTION OF THE PREFERRED EMBODIMENT

The display device of the present invention will now be described.

Figure 4:
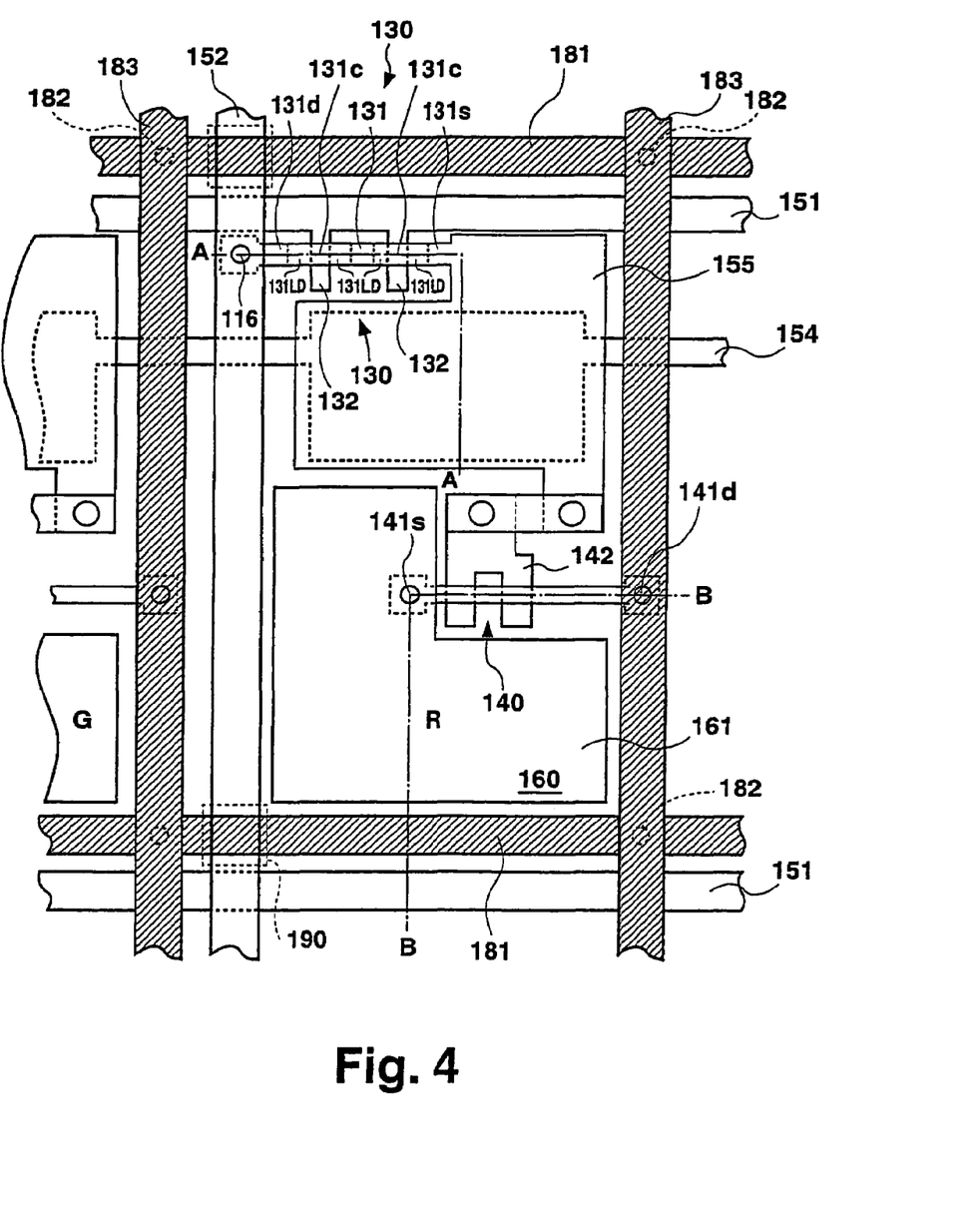
FIG. 4 shows a plan view of an EL display device according to an embodiment of the present invention.
Figure 5:
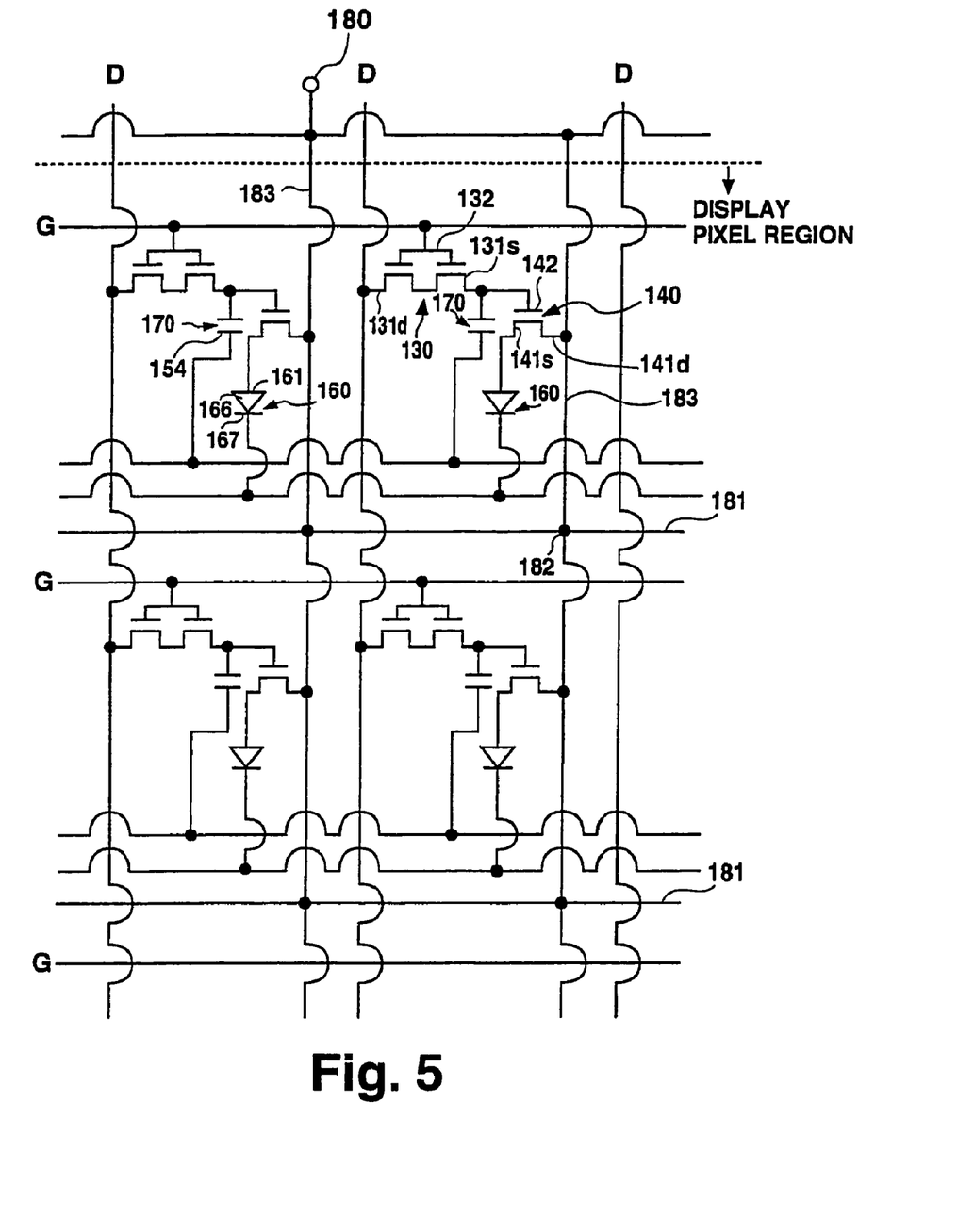
FIG. 5 is a diagram showing an equivalent circuit for display pixels of the EL display device according to the embodiment of the present invention.
Figure 6A:
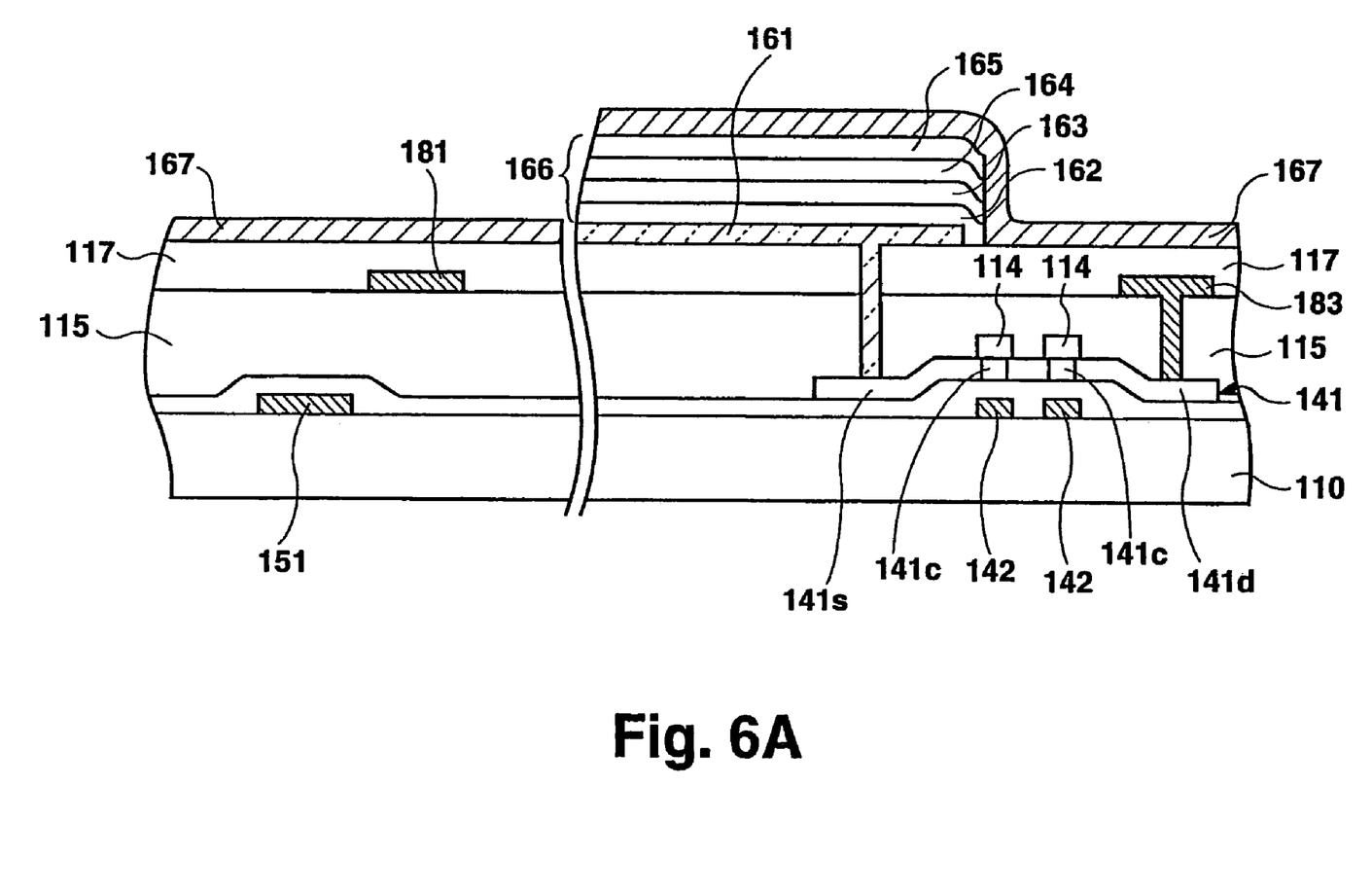
FIG. 6A show a cross-sectional view of the EL display device along line B—B of FIG. 4.
Figure 6B:
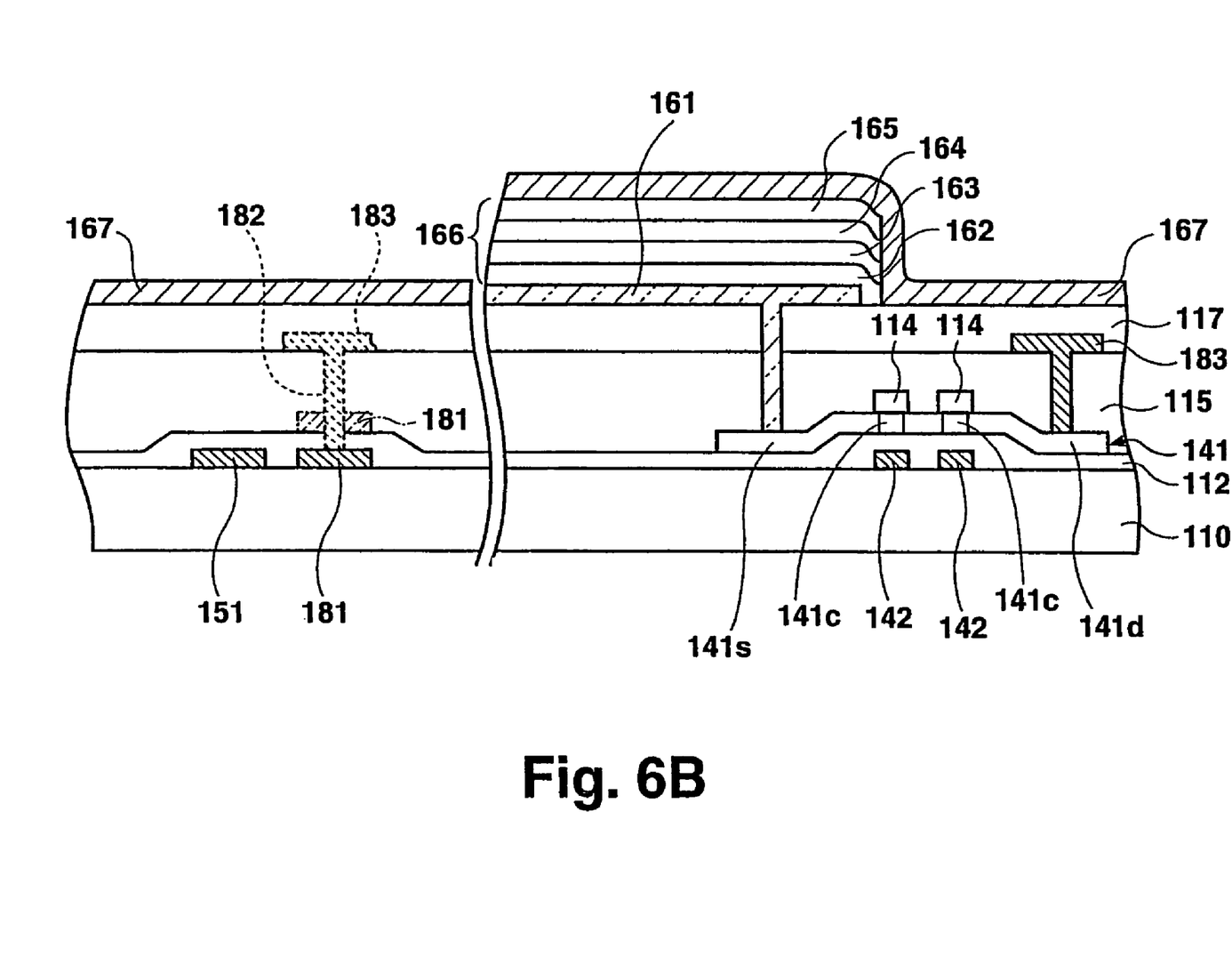
FIG. 6B shows another cross-sectional view of the EL display device along line B—B of FIG. 4.

FIG. 4 is a plan view illustrating one display pixel in an organic EL display device implementing the present invention. FIG. 5 is a diagram showing an equivalent circuit for a plurality of display pixels of the organic EL display device. Each of FIGS. 6A and 6B shows a cross-sectional view taken along line B—B in FIG. 4. A separate drawing for the cross-sectional view taken along line A—A of FIG. 4 is not included because this view is identical to the previously described FIG. 3A.

In the present embodiment, TFTs having gate electrodes disposed underneath the active layer 131, namely, bottom-gate type TFTs, are employed as the first and second TFTs 130,140. The TFTs of the present embodiment use a p-Si film as the active layers, and include gate electrodes 132,142 comprising the double-gate structure.

The organic EL display device is configured by sequentially forming layers of TFTs and organic EL elements on a substrate 110 made of a material such as glass or synthetic resin, or alternatively on a conductive or semi-conductor substrate having an insulating film of $SiO_2$, SiN, or a similar material on its surface.

As shown in FIGS. 4 and 5, each display pixel is formed in a region surrounded by gate signal lines 151 and drain signal lines 152. The organic EL display device is formed by arranging display pixels having organic EL elements 160 and TFTs 130,140 on the substrate 110 in a matrix.

The first TFT 130 is disposed near a intersection of the two signal lines 151, 152. The source 131s of the TFT simultaneously functions as a capacitor electrode 155 which, together with the opposing storage capacitor electrode 154, forms a storage capacitor. The source 131s is connected to a gate electrode 142 of the second TFT 140. The source 141s of the second TFT 140 contacts with the anode 161 of the organic EL element 160. The drain 141d is connected to a power source line 183 for driving the organic EL element.

Near the TFT 130, a first storage capacitor electrode 154 is disposed in parallel with a gate signal line 151. The first storage capacitor electrode 154 is made of a material such as chromium, and a predetermined common voltage is applied to each of the storage capacitor electrode 154 as shown in FIG. 5. The storage capacitor electrode 154 is opposed to the capacitor electrode 155 via a gate insulating film 112 and together stores charges, forming a storage capacitor.

In the first TFT 130 provided as the switching TFT, as shown in FIGS. 4 and 3A, gate signal lines 151 made of refractory metal such as Cr or Mo which also serve as gate electrodes 132 are formed on an insulator substrate 110 made of quartz glass, non-alkali glass, or a similar material. Also disposed on the substrate 110 are drain signal lines 152 composed of Al and power source lines 183 also composed of Al and serving as the power source for the organic EL elements. The first storage capacitor electrode 154 made of refractory metal such as Cr or Mo are provided in the same layer as the gate electrodes.

After forming the gate signal lines 151 (gate electrodes 132) and first storage capacitor electrodes 154, a gate insulating film 112 and an active layer 131 composed of p-Si film are sequentially formed. Stopper insulating films 114 made of $SiO_2$ are provided on top of the active layer 131 above the gate electrodes 132. The stopper insulating films 114 serve as masks that cover channels 131c for preventing ions from entering into the channels 131c during ion doping performed for forming the source 131s and the drain 131d. The active layer 131 is provided with the so-called LDD structure. Specifically, low-concentration regions 131LD are formed on both sides of each gate 132. The source 131s and the drain 131d, which are high-concentration regions, are further disposed on the outboard sides of the low-concentration regions 131LD. The p-Si film of the active layer extends over the storage capacitor electrode 154 to function as the second storage capacitor electrode 155 which forms a storage capacitor together with the storage capacitor electrode 154 via the gate insulating film 112.

An interlayer insulating film 115 formed by sequential lamination of a $SiO_2$ film, a SiN film, and a $SiO_2$ film is provided on the entire surface over the gate insulating film 112, the active layer 131, and stopper insulating films 114. A contact hole formed in a position corresponding to the drain 141d is filled with metal such as Al, forming a drain electrode 116. Further, a planarizing insulating film 117 made of an organic resin or a similar material is formed over the entire surface for planarization.

The second TFT 140, or the TFT for driving the organic EL element 160, will next be described.

As shown in FIGS. 6A and 6B, gate electrodes 142 composed of refractory metal such as Cr or Mo are formed on the insulator substrate 110 made of quartz glass, non-alkali glass, or a similar material.

Further on top, a gate insulating film 112 and an active layer 141 composed of p-Si film are sequentially formed.

The active layer 141 is provided with intrinsic or substantially intrinsic channels 141c formed above the gate electrodes 142. The source 141s and drain 141d are formed on respective sides of these channels 141c by performing ion doping with p-type impurities such as boron (B) while covering those respective sides with a resist.

An interlayer insulating film 115 formed by sequential lamination of a SiO$_2$ film, a SiN film, and a SiO$_2$ film is provided on the entire surface over the gate insulating film 112 and the active layer 141. A contact hole formed in a position corresponding to the drain 141d is filled with metal such as Al, forming a power source line 183 connected to a power source input terminal 180. Further, a planarizing insulating film 117 made of an organic resin or a similar material is formed over the entire surface for planarization. A contact hole is formed in the planarizing insulating film 117 in a position corresponding to the source 141s. A transparent electrode made of ITO that contacts the source 141s through this contact hole, namely, the anode 161 of the organic EL element, is formed on the planarizing insulating film 117.

The organic EL element 160 is configured such that an emissive element layer 166 is interposed between the anode 161 and the cathode 167. In the present embodiment, the anode 161, the emissive element layer 166, and the cathode 167 are formed in that order on top of the planarizing insulating film 117. According to the present embodiment, the emissive element layer includes an organic compound as its component. The emissive element layer is constituted by forming, in order, a first hole-transport layer 162, a second hole-transport layer 163, an emissive layer 164, and an electron-transport layer 165.

The anode 161 is, as mentioned above, a transparent electrode formed using ITO. The first hole-transport layer 162 is composed using MTDATA (4,4',4"-tris(3-methylphenylphenylamino)triphenylamine). The second hole-transport layer 163 is composed using TPD (N,N'-diphenyl-N,N'-di(3-methylphenyl)-1,1'-biphenyl-4,4'-diamine). The emissive layer 164 is formed using quinacridon derivatives and Bebq$_2$ (bis(10-hydroxybenzo[h]quinolinato) beryllium). The electron transport layer 165 is composed using Bebq$_2$. The cathode 167 is made of a magnesium-indium alloy. The cathode 167 is formed as a common electrode covering the entire surface of the substrate 110 on which the organic EL display device is disposed, or covering at least the display region. It should be noted that the configuration and component materials of the organic EL elements 160 are not limited to the above-mentioned examples, and that other configurations and materials may similarly be used.

Next explained are the power source lines (main power source lines) 183 and the power source bypass lines (bypass power source lines) 181 for supplying drive current (power) to the above-described organic EL elements 160 via the input terminals 180. FIGS. 6A and 6B illustrate examples of bypass lines 181 formed by different manufacturing processes.

Each power source line 183 is arranged within the display pixel region in parallel with the drain signal lines (data lines) 153 along the column direction, as shown in FIG. 4. Each power source line 183 is connected to display pixels assigned as forming one column, and supplies drive current from the power source input terminal 180 to the organic EL elements 160 via the second TFTs 140.

In the present invention, the power source lines 183 disposed for each column between display pixels are electrically connected by bypass lines 181 arranged along the horizontal direction in FIG. 4 (the row direction), providing a circuit configuration having a grid pattern within the display pixel region. In the related art wiring configuration shown in the previously-described FIG. 2, the distance along the column direction from the power source input terminals 180 to display pixels imposed a restriction on the power (current) that can be supplied to the display pixel. However, by providing the bypass lines 181 along the row direction as in the present embodiment, the display pixels can simultaneously receive current supply along the row direction via the bypass lines 181. Accordingly, in one row, the plurality of power source lines 183 arranged along the column direction can be maintained approximately at the same potential, reducing the dependency of power to be supplied to each display pixel on the distance from the input terminal 180.

The bypass lines 181 are formed using a low-resistance, conductive material such as Al. The bypass lines 181 can be integrally formed in one process with the power source lines 183 on the interlayer insulating film 115 as shown in FIG. 6A, by forming line on the substrate in a grid pattern. The lines 183 and 181 may alternatively be formed in different processes and connected via contact holes 182. In either case, to prevent short-circuiting at the intersections with the drain signal lines 152 formed on the interlayer insulating film 115 similar to the power source lines 183 and the bypass lines 181, it is necessary to provide insulating films 190 in the form of pads at the intersections of the lines 152 and 181 for interlayer insulation. This is shown in FIG. 4 using dotted lines.

Further, as shown in FIG. 6B, each bypass line 181 may be formed in the same process as the gate signal lines 151 using a refractory metal such as Mo along the row direction in parallel with the gate signal lines 151. In this case, contact holes 182 are created as shown by dotted lines in FIG. 6B in positions where the bypass lines 181 intersect the power source lines 183 formed on the interlayer insulating film 115. The lines 183 and 181 are connected via the contact holes 182. The bypass lines 181 can also be formed in a different layer from the gate signal lines 151 on the gate insulating film 112, as shown by dotted lines in FIG. 6B, and connected via the contact holes 182 to the lines 183 formed on the interlayer insulating film 115.

Connecting of power source lines 183 of adjacent display pixels using bypass lines 181 as described above can minimize increase in resistance in locations more distant from the power source input terminals 180 due to the wiring length of the power source lines 183. The organic EL elements 160 disposed in each display pixel can therefore adequately receive current that should actually be supplied, preventing decrease in display luminance due to increased resistance.

Resistance can be further reduced by enlarging the wiring width of the power source lines 183 and the bypass lines 181 as shown in FIG. 4. The organic EL elements 160 disposed in each display pixel can therefore adequately receive current that should actually be supplied, preventing lack of display luminance. In addition, such widening of the line width can prevent generation of electromigration. The line width of 183 and 181 may be, for example, as large as the width of the drain signal line 152, or even larger.

With respect to reduction of resistance, it is preferable that the bypass lines 181 be formed for each row as shown in the above-described FIGS. 4 and 5. However, it is not necessary that bypass lines 181 be provided for each row. The bypass lines 181 may be formed for every predetermined number of rows. Moreover, the presence of at least one bypass line 181 in the display pixel region can contribute to enhancement of uniformity in the luminance within the region. When more than one bypass line 181 is provided in the pixel region, the power source lines 183 constitute a circuit configuration comprising a grid pattern within the region, regardless of the physical connection method between the bypass lines 181 of the present invention and the power source lines 183.

While the above embodiment referred to a case where the gate electrodes 132, 142 constitute the double gate structure, the present invention is not limited to such a structure. The same advantages of the present invention can be achieved using a single gate structure or a multi-gate structure having more than three gates.

Although p-Si films were employed as the semiconductor films in the above embodiment, semiconductor films comprising microcrystalline silicon films or non-crystalline silicon films may alternatively be used.

In view of manufacturing cost reduction and alleviation variations of TFT characteristics, it is preferable to form corresponding components in each pixel in the same manufacturing processes. Such corresponding components may include the gate electrodes 132,142, gate insulating film 112, and active layers 131,141 of the first and second TFT 130,140, the interlayer insulating film 115, and the planarizing insulating film 117. When poly-silicon is used as the active layers in each TFT as described in the above embodiment, it is possible to form these active layers in same process. For example, an amorphous silicon film may be formed on the entire substrate and then polycrystallized by a method such as laser annealing. The poly-silicon film created in this way may be used as an active layer in each of the first and second TFTs 130, 140.

Further, while the above embodiment was explained using an organic EL display device as an example, the present invention is not limited to organic EL display devices. Similar effects as those accomplished in the organic EL display device can be achieved in an inorganic EL display device which uses, as emissive elements instead of organic EL elements, inorganic EL elements comprising inorganic emissive materials. Alternatively, the present invention may be applied in a vacuum fluorescent display (VFD) having a fluorescent layer as the emissive layer between two electrodes.

What is claimed is:

1. An electroluminescence display device, comprising:
a plurality of display pixels arranged in a matrix within a display pixel region on a substrate, said display pixels having electroluminescence elements including an emissive layer between first and second electrodes and storage capacitors for storing display data for controlling power to be supplied to the electroluminescence elements; wherein
within said display pixel region, power source lines for supplying power from a power source to said electroluminescence elements are disposed in a grid pattern extending in row and column directions of the matrix, said power source lines intersect at a position between said display pixels.

2. The device defined in claim 1, wherein said power source lines include main power source lines arranged in plural numbers within said display pixel region, and at least one bypass power source line extended to intersect and connect said main power source lines within said display pixel region.

3. The device defined in claim 2, wherein each of said display pixels further comprises:
a first thin film transistor having a gate electrode connected to a gate line, and a first electrode region connected to a data line; and
a second thin film transistor having a gate electrode connected to a second electrode region of said first thin film transistor, a first electrode region connected to one of said main power source lines, and a second electrode region connected to said electroluminescence element.

4. The device defined in claim 3, wherein said first and said second thin film transistors include active layers composed of poly-silicon.

5. The device defined in claim 1, wherein said power source lines include main power source lines arranged in plural numbers along the column direction of said matrix within said display pixel region, and at least one bypass power source line extended in the row direction of said matrix within said display pixel region to intersect and connect said main power lines.

6. The device defined in claim 5, wherein each of said display pixels further comprises:
a first thin film transistor having a gate electrode connected to a gate line, and a first electrode region connected to a data line; and
a second thin film transistor having a gate electrode connected to a second electrode region of said first thin film transistor, a first electrode region connected to one of said main power source line, and a second electrode region connected to said electroluminescence element.

7. The device defined in claim 6, wherein said first and said second thin film transistors include active layers composed of poly-silicon.

8. The device defined in claim 5, wherein said main power source lines and said bypass power source line are conductive line integrally formed.

9. The device defined in claim 5, wherein said main power source lines and said bypass power source line are conductive lines separately formed in different processes.

10. The device defined in claim 1, wherein said emissive layer is a layer using an organic compound as an emissive material.

11. An electroluminescence display device, comprising:
a display pixel region having a plurality of display pixels arranged in a matrix, wherein each of said display pixels includes:
an electroluminescence element having an emissive layer between an anode and a cathode;
a first thin film transistor having a gate electrode connected to a gate line, and a first electrode region connected to a data line; and
a second thin film transistor having a gate electrode connected to a second electrode region of said first thin film transistor, a first electrode region connected to power source lines for supplying power from a power source to said electroluminescence element, and a second electrode region connected to said electroluminescence element, said power source lines intersect at a position between said display pixels; and
a storage capacitor having a first capacitor electrode electrically connected to the gate electrode of the second thin film transistor and to the second electrode region of the first thin film transistor and a second capacitor electrode formed opposing the first capacitor electrode having an insulating film interposed between the first and second capacitor electrodes; wherein
said power source lines are provided along a column direction of said matrix within said display pixel region, and those power source lines that are associated with the display pixels adjacently arranged along a row direction are connected to one another by a bypass power source line extending in the row direction of said matrix.

12. The device defined in claim 11, wherein said first and said second thin film transistors include active layers composed of poly-silicon.

13. The device defined in claim 11, wherein said main power source lines and said bypass power source line are conductive line integrally formed.

14. The device defined in claim 11, wherein said main power source lines and said bypass power source line are conductive lines separately formed in different processes.

15. The device defined in claim 11, wherein said emissive layer is a layer using an organic compound as an emissive material.

16. An emissive display device comprising:
a plurality of display pixels arranged in a matrix within a display pixel region, each of said display pixels having emissive elements including an emissive layer between first and second electrodes and a storage capacitor for storing display data for controlling power to be supplied to the emissive elements; wherein
within said display pixel region, power source lines for supplying power from a power source to said emissive elements are disposed in a grid pattern extending in row and column directions of the matrix, said power source lines intersect at a position between said display pixels.

17. The device defined in claim 16, wherein said power source lines include a main power source lines arranged in plural numbers along the column direction of said matrix within said display pixel region, and at least one bypass power source line extended in the row direction of said matrix within said display pixel region to intersect and connect said main power lines.

18. The device defined in claim 17, wherein each of said display pixels further comprises:
a first thin film transistor having a gate electrode connected to a gate line, and a first electrode region connected to a data line; and
a second thin film transistor having a gate electrode connected to a second electrode region of said first thin film transistor, a first electrode region connected to one of said main power source lines, and a second electrode region connected to said emissive element.

19. The device defined in claim 18, wherein said first and said second thin film transistors include active layers composed of poly-silicon.

20. The device defined in claim 17, wherein said main power source lines and said bypass power source line are conductive line integrally formed.

21. The device defined in claim 17, wherein said main power source lines and said bypass power source line are conductive lines separately formed in different processes.

22. The device defined in claim 16, wherein said emissive layer is a layer using an organic compound as an emissive material.

23. An electroluminescence display device, comprising:
a plurality of display pixels arranged in a matrix within a display pixel region on a substrate, said display pixels having electroluminescence elements each having a layered structure constructed by forming an anode and a cathode with at least an emissive layer formed therebetween; and
a storage capacitor for storing display data for controlling power to be supplied to the electroluminescence elements,
wherein within said display pixel region, power source lines for supplying power from a power source to said electroluminescence elements are disposed in a grid pattern extending in row and column directions of the matrix,
wherein the power source lines are selectively and electrically connected to either said anode or said cathode of said electroluminescence element to supply power to connected one of said anode or said cathode.

24. An electroluminescence display device, comprising:
a display pixel region having a plurality of display pixels arranged in a matrix, wherein each of said display pixels includes:
an electroluminescence element having an emissive layer between an anode and a cathode;
a first thin film transistor having a gate electrode connected to a gate line, and a first electrode region connected to a data line; and
a second thin film transistor having a gate electrode connected to a second electrode region of said first thin film transistor, a first electrode region connected to power source lines for supplying power from a power source to said electroluminescence element, and a second electrode region connected to said electroluminescence element;
a storage capacitor having a first capacitor electrode electrically connected to the gate electrode of the second thin film transistor and to the second electrode region of the first thin film transistor and a second capacitor electrode formed opposing the first capacitor electrode having an insulating film interposed between the first and second capacitor electrodes;
wherein said power source lines are provided along a column direction of said matrix within said display pixel region, and said power source lines that are associated with the display pixels adjacently arranged along a row direction are connected to one another by a bypass power source line extending in the row direction of said matrix,
wherein said power source lines are selectively and electrically connected to either said first electrode or said second electrode of said electroluminescence element to supply power to said first electrode or said second electrode.

25. An emissive display device comprising:
a plurality of display pixels arranged in a matrix within a display pixel region, each of said display pixels having emissive elements each having a layered structure constructed by forming an anode and a cathode with at least an emissive layer formed therebetween;
a storage capacitor having a first capacitor electrode electrically connected to the gate electrode of a second thin film transistor and to the second electrode region of a first thin film transistor and a second capacitor electrode formed opposing the first capacitor electrode having an insulating film interposed between the first and second capacitor electrodes; wherein
within said display pixel region, power source lines for supplying power from a power source to said emissive elements are disposed in a grid pattern extending in row and column directions of the matrix,
wherein said power source lines are selectively and electrically connected to either said anode or said cathode of said emissive elements to supply power to connected one of said anode or said cathode.

* * * * *